ALL NPN TRANSISTOR DC AMPLIFIER

Filed Feb. 14, 1967 2 Sheets-Sheet 1

INVENTOR
CHARLES YAGHER, JR.

BY Thomas A. Brody
ATTORNEY

INVENTOR

CHARLES YAGHER, JR

BY Thomas A. Brody

ATTORNEY

United States Patent Office 3,462,698
Patented Aug. 19, 1969

3,462,698

ALL NPN TRANSISTOR DC AMPLIFIER

Charles Yagher, Jr., Decatur, Ill., assignor to General Electric Company, a corporation of New York Filed Feb. 14, 1967, Ser. No. 616,055
Int. Cl. H03f 3/26, 3/30, 3/42
U.S. Cl. 330—15 29 Claims

ABSTRACT OF THE DISCLOSURE

A class B push-pull transistor comprises a pair of NPN output transistors having their emitter collector paths series connected with an inductive load shunting the emitter collector path of one output transistor. The output transistors are driven by a paraphase NPN transistor stage that responds to a low level input NPN transistor stage. A biasing resistor in the emitter circuit of the driver transistor biases the emitter base junction of said one transistor. Stabilizing feedback circuits are provided to maintain the bias across the resistor fixed so that thermal runaway of the output transistors does not occur. Positive bootstrapping between the output stage and the driver increases the drive signal of the driver while providing ripple filtering for the power supply of all four transistors. Negative signal feedback from the output to the low level input is provided to reduce distortion.

The present invention relates generally to class B audio amplifiers and more particularly to an all NPN transistor amplifier wherein preamplifier and driver stages energized to class A bias conditions maintain output transistors in a class B configuration.

NPN type transistors have low characteristic leakage currents wihch enable them to have considerably more stable thermal responses than PNP type transistors. In addition, the cost of more recently introduced NPN transistors has been considerably less than that of corresponding PNP transistors. As a result, for commercial applications where equipment is subjected to considerable variation in ambient temperautre and cost is of paramount importance, the use of NPN transistors in audio amplifiers is considered quite desirable.

According to the present invention, biasing circuits are provided for driving class B NPN push-pull output stages adapted to drive inductive speaker loads. The emitter collector paths of the two output transistors are connected between the positive terminal of a single power supply and a reference or ground potential and the speaker load is connected between the emitter and collector of one of the output transistors. One of the output transistors provides current gain to the load while the other provides voltage and current gains. An NPN driver stage is arranged so that the output transistor providing voltage and current gains is supplied with a relatively large current while the output transistor having a relatively large current gain is supplied with a relatively large voltage. Thereby, the total power gain of the two output transistors, combined with the driver stage, is the same over each half cycle of the input signal.

Particular problems of amplifiers are thermal runaway and cross-over distortion. In response to increasing temperatures, the base-emitter junction voltages decrease causing collector current in the output stage to increase and approach a thermal runaway condition. The base emitter bias voltage has a tendency to decrease at a rate of between 1 to 3 millivolts per degree centigrade, which temperature increase can occur as a result of ambient temperature changes and internal transistor power dissipation.

According to one embodiment of the present invention, thermal dissipation in the output stages is maintained constant by providing a feedback path, between the collector of a driver stage and the base of an NPN preamplifier stage. The feedback biasing connection compensates for voltage variations across a resistor which establishes the base emitter voltage for one of the output transistors and is connected in the emitter circuit of the driver. The biasing connection between the driver and preamplifier stages overcomes the tendency of the output stage to be in a thermal runaway condition because the preamplifier and driver stages are connected in a common emitter circuit that applies relatively low forward bias to the push-pull transistors.

In another embodiment of the invention, the tendency for thermal runaway of the output stage is controlled by connecting a resistor in series with the base emitter paths of both output transistors. The voltage across the resistor is connected in a negative feedback path to the preamplifier stage, whereby the bias voltage on the preamplifier stage is varied in a manner to compensate for temperature increases that could otherwise result in increased current in the class B power amplifier since the transistors thereof are heavily forward biased.

In still another embodiment of the invention, thermal runaway due to ambient temperature variations is overcome by connecting the preamplifier stage in such a manner that its gain is inversely related to the gain of the driver stage as a function of temperature.

Another feature of the invention resides in a positive feedback connection from the output stage to the driver stage by way of a coupling capacitor. The positive feedback circuit provides boot-strapping so that maximum voltage swings can be obtained across the output impedances of the driver amplifier for both the positive and negative half cycles of the input signal. Of course, obtaining maximum voltage swing is particularly desirable because it enables the output stages to be operated with greatest efficiency. Another advantage of the bootstrapping capacitor is that ripple in the D.C. power supply energizing the collector emitter paths of the amplifying transistors can be filtered. The filter is formed with the bootstrapping capacitor which is connected in series with the inductive speaker and speaker coupling capacitor to provide a low impedance circuit for the ripple frequency of the D.C. supply. Reduction of ripple in the preamplifier stage is a particular asset because a large ripple component superimposed on the low level signal applied to the stage adds appreciably to the hum derived from the speaker.

According to another aspect of the invention, in one embodiment thereof, a larger D.C. voltage is applied to the driver and preamplifier stages than is applied to the transistors in the output stage. The larger collector voltage energization for the preamplifier and driver stages has a greater ripple percentage than the voltage applied to the output stage so that a single pi section filter can be utilized. The effects of ripple in the collector energization voltages for the preamplifier and driver stages are not particularly detrimental due to the filtering effects of the bootstrapping capacitor and the improved performance resulting from the greater voltage is appreciable. Improved performance results because the bias applied to the base electrodes of the output transistors is maintained relatively constant even for large amplitude input signals. It is important to maintain the bias of the output transistors constant to eliminate the problems of cross-over distortion. If cross-over distortion, rapid changes of a push-pull transistor input impedance resulting from switching between a conductive and non-conductive stage, becomes excessive, the detrimental effect on a listener is obvious.

While cross-over distortion is a problem in audio amplifiers for driving speakers, it is not noticeable to the ear of a listener for large volume outputs. It is a significant problem, for most listeners, only for low amplitude signals. In consequence, the amplifier of the present invention is designed so that for signal levels above 50 percent of maximum output cross-over distortion of the output transistors is tolerated while no cross-over distortion exists for the low level input signals. This characteristic of crossover distortion diminishes as the waveform is decreased from maximum output to a lower level, and is used to facilitate the distortion test at high production rates.

According to another feature of the present invention, the bias points of the output transistors are stabilized even with significant changes in the current amplification factors of the preamplifier and driver transistors. Stabilization of the output transistor bias points is accomplished by establishing the bias voltage for one of the transistors through relatively low valued resistors that shunt the emitter base junctions of the preamplifier and driver stages. These relatively low valued resistors supply relatively constant current to the biasing circuit for the output transistor regardless of the base emitter impedances of the preamplifier and driver stages.

A further feature of the invention is the relatively flat response achieved between 100 Hz. and 10,000 kHz. with a minimum of components. The flat characteristics are established by utilizing D.C. coupling as the sole means of forward signal coupling between each of the transistors comprising the amplifier. Any distortion introduced by variations of the transistor current gain characteristics as a function of signal level is overcome to a large extent by negative feedback circuitry provided for the input signal.

It is accordingly an object of the present invention to provide a new and improved NPN class B audio amplifier.

Another object of the present invention is to provide an NPN class B amplifier having minimum cross-over and total harmonic distortion commensurate with relatively inexpensive, large scale production devices.

A further object of the present invention is to provide a new and improved class B amplifier wherein problems of thermal runaway in the output stages are obviated.

Still a further object of the present invention is to provide a new and improved class B, D.C. coupled amplifier having a flat frequency response over a relatively wide portion of the audio spectrum.

A further object of the present invention is to provide an audio amplifier wherein variations in the A.C. voltage utilized for energizing the amplifier have a minimum effect on the characteristics of the amplifier.

Still another object of the present invention is to provide a new and improved class B amplifier having reduced hum and ripple characteristics due to filtering circuits incorporated therein which also are utilized for signal coupling.

Still a further object of the present invention is to provide a new and improved amplifier that is readily tested for cross-over distortion wherein cross-over distortion below 50 percent of maximum output is not tolerated but such distortion above 50 percent of maximum output is permitted.

The above and still further objects, features and advantages of the present invention will become apparent upon consideration of the following detailed description of several specific embodiments thereof, especially when taken in conjunction with the accompanying drawings, wherein.

Figures 1, 2, 3:
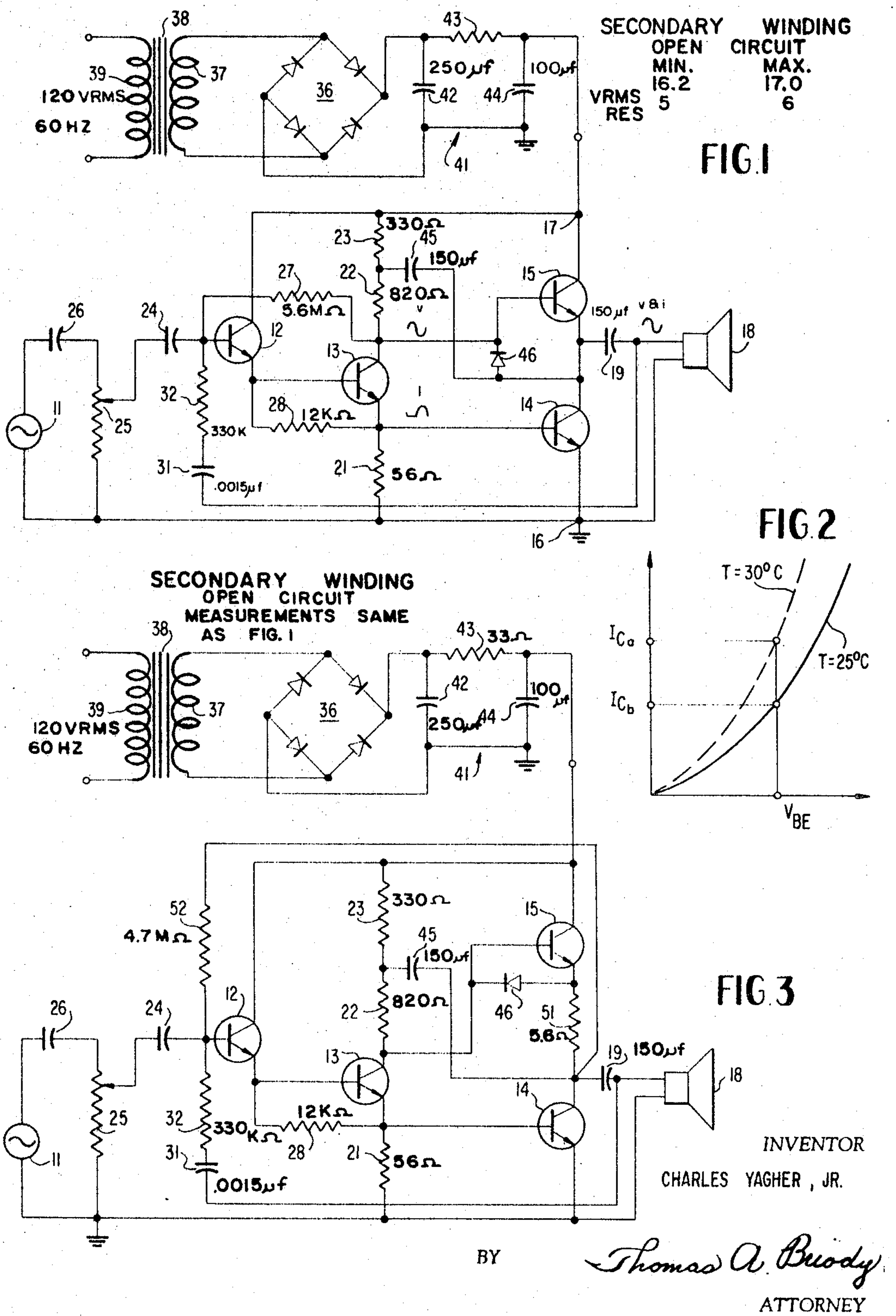
FIGURE 1 is a circuit diagram of one embodiment of the present invention.
FIGURE 2 illustrates characteristic curves of the transistors employed in the circuit of FIGURE 1.
FIGURE 3 is a circuit diagram of a modification of the circuit of FIGURE 1.

Reference is now made to FIGURE 1 of the drawings wherein the D.C. coupled audio amplifier, including four NPN silicon transistors, is illustrated as being responsive to source 11 of an audio frequency spectrum. Audio source 11 is amplified by NPN transistors 12 and 13, in a manner described infra, so that the bases of series connected transistors 14 and 15 are driven with waves respectively in-phase and out-of-phase with the voltage of source 11. The signal supplied to the base of transistor 15 is voltage amplified relative to source 11 and is a faithful replica of the waveform of the source while the signal applied to the base of the transistor 14 is a replica of only the negative half cycle of the source. The signal applied to the base of transistor 14 during the positive half cycle of source 11 is not a replica of the source waveform but has a relatively small value because of the low impedance of the base-emitter junction of transistor 14 in response to the signal applied thereto. The signal applied to the base of transistor 14 is current amplified relative to the amount of current supplied by source 11 but has less voltage, even during the negative half cycle of the source, than the voltage of the source. Hence the signals applied to the bases of transistors 14 and 15 can be considered as relatively out-of-phase with respect to each other, with the voltage applied to transistor 15 being a voltage amplified replica of signal source 11 and the signal applied to transistor 14 a current amplified replica of the positive half cycle of source 11.

The emitter collector paths of transistors 14 and 15 are series connected between ground terminal 16 and the positive 18 volt D.C. level maintained at terminal 17. At the junction between the collector of transistor 14 and the base of transistor 15, the inductive load of speaker 18 is connected via A.C. coupling capacitor 19 and the emitter of transistor 15. The other terminal of speaker 18 is connected to ground terminal 16.

In the circuit of FIGURE 1, the base of silicon transistor 14 is biased with respect to its emitter at approximately 0.6 volts and controls the current flowing through transistors 14 and 15. The base of transistor 15 is considered to be floating. Transistors 14 and 15 function as a true class B amplifier and each conducts for only one-half of each cycle of the waveforms derived from source 11. In response to a positive half cycle of current being applied to the base of transistor 14, the transistor is rendered into a conducting state to provide a voltage amplified negative half cycle swing at its collector electrode. Simultaneously, negative voltage is applied to the base of transistor 15, cutting off its emitter collector path so that only leakage current flows from terminal 17 through transistor 15 to establish the collector bias for transistor 14. The current supplied to the base of transistor 14 is coupled through its collector to speaker 18, together with current from terminal 17. The voltage and current amplifications of transistor 14 and the current amplification of transistors 12 and 13 provide total power gain, relative to source 11, for the positive half cycle of the source.

During the opposite half cycle when a positive voltage swing is applied to the base of transistor 15 and a negative current is applied to the base of transistor 14, the latter transistor is driven to cut off while transistor 15 is providing current gain. The positive half cycle of current derived at the emitter of transistor 15 is supplied to speaker load 18, whereby the power gain during the negative half cycle of source 11 equals the power gain during the positive half cycle and a relatively accurate replica of the signal source is fed to the speaker.

All of the silicon transistors in the circuit were chosen because of their low current leakage characteristics, $I_{CBO}$. The leakage current for each of the transistors 14 and 15 is related to its respective D.C. collector current by:

$$I_C = H_{FE} \cdot I_B + (H_{FE}+1) I_{CBO} \quad (1)$$

where:

$I_C$=D.C. collector current in milliamperes,
$H_{FE}$ is D.C. current gain, approximately equal to $I_C/I_B$,
$I_B$=D.C. base current, in milliamperes, and
$I_{CBO}$ is collector leakage current in milliamperes.

The value of $I_{CBO}$ is temperature sensitive and can be approximated generally as increasing by a factor of two for every 9° centigrade rise in temperature. For PNP transistors, the D.C. collector leakage current, $I_{CBO}$, is great enough that the product $(H_{FE}+1)I_{CBO}$ becomes a significant factor and compensation for it must be taken. NPN transistors, to the contrary, have a relatively small value of collector leakage current so that the second term in the right hand portion of Equation 1 can be ignored relative to the product $H_{FE}I_B$ and Equation 1 can be rewritten as:

$$I_C = H_{FE} I_B \quad (2)$$

Hence, the D.C. current characteristics of transistors 14 and 15 are relatively insensitive to ambient temperature changes so that many of the compensating circuits frequently employed with prior art output driver transistor stages need not be included in the circuit of the present invention.

To derive the opposite polarity signals having current and voltage gain applied to transistors 14 and 15, respectively, NPN paraphase amplifier or phase splitter stage 13 is provided. The emitter and collector electrodes of transistor 13 are directly connected to the bases of transistors 14 and 15, respectively. Emitter collector energization for transistor 13 is established by connecting resistor 21 between the transistor emitter and ground, while the transistor collector is connected through the series combination of resistors 22 and 23 to the positive voltage at terminal 17.

The base of transistor 13 is supplied with an accurate replica of the waveform of source 11. Since transistor 13 is biased for class A operation, the voltages at the emitter and collector electrodes thereof are accurate replicas of the voltage of source 11. Of course, the voltage swing at the collector of transistor 13 is of opposite polarity from the source voltage, while the emitter swing of transistor 13 is in-phase with the voltage of source 11.

Phase splitter 13 provides voltage and current gains at its collector for the signal applied to its based. To the contrary, the voltage swing at the emitter of transistor 13 is slightly reduced relative to the voltage applied to the base but the current level of the emitter variations is amplified relative to the current applied to the transistor 13 base for the positive half cycle of source 11. Current gain is achieved only during the positive half cycle of source 11 because of the relatively large cut-off input impedance of transistor 14 during the negative half cycles of the voltage swing at the base of transistor 13. As a result, the current supplied to the base of transistor 14 is a replica of source 11 only during its positive half cycle while the voltage applied to the base of transistor 15 is a replica of the source during a cycle of the source.

The current gain supplied by the emitter of transistor 13 is equal to the emitter current gain of transistor 15, while the voltage gains at the collectors of transistors 13 and 14 are approximately equal. In consequence, the combined current and voltage gains of the push-pull output stage comprising transistors 14 and 15 and the paraphase driver stage 13 are equal during both the positive and negative half cycles of source 11.

The base of transistor 13 is driven by the emitter of NPN transistor 12, connected in the common collector mode so that its base is responsive to signal source 11 via the connection existing through capacitor 24, shunt loudness control potentiometer 25 and the source 11 capacitance, represented by capacitor 26. The base of preamplifier transistor 12, a current amplifier for signal source 11, is biased into class A operation by its connection to resistor 27, in a negative feedback circuit to the junction between resistor 22 and the collector of transistor 13. The D.C. bias current supplied to the base of transistor 12 through resistor 27 results in the derivation of a D.C. current at the emitter of transistor 12 to provide stabilized bias through the voltage drop of resistor 28, connected between the emitters of transistors 12 and 13. To prevent variations in the emitter base junction of transistor 13 from adversely changing the current supplied to the bias resistor 21, the value of resistor 28 is selected to provide a current path that has an impedance considerably less than the impedance of the junction.

The emitter current of transistor 12 flowing through bias resistor 28 is also coupled to resistor 21, connected in the emitter circuit of transistor 13 to establish class B operating bias conditions for transistor 14. The D.C. voltage established across resistor 21 in response to the emitter current of transistor 12 determines the D.C. collector voltage of transistor 13 to establish D.C. bias for class B operation of output transistor 15. Thereby, the base emitter network of transistor 12 can be considered as establishing the bias points for each of the remaining transistors 13, 14 and 15 in the circuit.

The bias level established at the base of transistor 12 is such that the input impedance is relatively large, on the same order of magnitude as the internal impedance of source 11, that is, e.g. a piezoelectric crystal phono pickup or the output stage of an FM tuner. By matching the input impedance to the internal impedance of source 11, the low frequency response of the amplifier is maintained with sources having low capacities, on the order of 1 to 2 nanofarads.

It has been found that the common collector connection of transistor 12, the connection of the transistor collector directly to the positive D.C. voltage at terminal 17, enables the voltage swing across speaker 18 to have a maximum value of within one volt of the 18 volt level of the D.C. power supply to terminal 17. It is postulated that the common collector configuration of transistor 12, which provides a relatively low impedance drive for the base circuit of transistor 13, enables the latter transistor to operate in a more efficient manner for its A.C. input signals, whereby maximum current swings occur simultaneously with maximum voltage swings.

A particular advantage of the circuit configuration of FIGURE 1 is that the bias level for each of the transistors is maintained at a relatively stable level as a function of temperature. The bias points of each of the transistors, with regard to temperature, are controlled predominantly by the characteristics of output transistor 14. As the emitter base junction temperature of transistor 14 increases, due either to power dissipation in the transistor or changes in ambient temperature, the voltage across the junction tends to decrease at a rate of 1 to 3 millivolts per degree centigrade. If the D.C. current through resistor 21, in the emitter circuit of transistor 13, is several times greater than the base current supplied to transistor 14, as occurs in response to relatively low signal levels of source 11, the voltage across resistor 21 remains constant but the collector current of transistor 14 increases at a rate determined by the base emitter junction temperature of the transistor.

The characteristics of transistor 14 as a function of base emitter voltage, collector current and temperature are illustrated in FIGURE 2. If the base voltage of transistor 14, the voltage across resistor 21, remains constant, as indicated by the vertical line at the abscissa $V_{BE}$, and temperature is raised from 25° C. to 30° C., the collector current of transistor 14 increases from the value $I_{CA}$ to $I_{CB}$. If the D.C. collector current of transistor 14 increases excessively, the transistor goes into "thermal runaway" and becomes damaged. As ambient temperature increases, the voltage-current characteristic for the base emitter junctions decreases as shown in FIGURE 2. For base emitter junctions having relatively large forward biases, the voltage across the junction remains constant and the emitter current increases.

For junctions having smaller forward biases, the emitter current only increases slightly while the base-emitter voltage decreases. For transistor 14, the emitter current only increases slightly when the base emitter voltage decreases. As the voltage across the base emitter junction of transistor 14 decreases, transistors 12 and 13 become more forwardly biased, tending to increase the emitter current of transistor 13. The tendency of this current to increase is minimized since biasing of the entire amplifier is controlled through bias resistor 27 which couples a negative feedback bias control voltage from the collector of trinsistor 13 to the base of transistor 12. The voltage coupled to the base of transistor 12 from the collector of transistor 13 is dependent almost entirely on the collector voltage of transistor 13, whereby any increase in the emitter current of transistor 13 has a tendency also to reduce the collector voltage. Any increase of current in transistor 14 has a tendency to decrease the voltage at terminal 17 because of the added power supply voltage drop that occurs. The reduced voltage at terminal 17 also decreases the voltage at the collector of transistor 13, whereby the bias current for transistors 12 and 13 is decreased. Any collector emitter current increase in transistor 13 also has a tendency to decrease the voltage at the collector of transistor 13, thus providing stabilizing current conditions.

The reduced voltage at the collector of transistor 13, across resistors 22 and 23, is increased and the collector voltage of transistor 14 drops. The reduced collector voltage is fed back to the base of transistor 12 to lower the current feed to the base of transistor 14 whereby the collector current of the latter transistor has a tendency to be reduced. The feedback stabilizing circuit through resistor 27 compensates for the tendency of the collector current to increase as a function of temperature to avoid the problems of thermal runaway.

Resistor 27, in addition to establishing stable bias conditions for transistor 14, provides negative A.C. signal feedback from the collector of transistor 13 to the base of transistor 12. The negative A.C. feedback provided by resistor 27 increases the waveform linearity so that fairly accurate voltage replicas of source 11 are derived at the emitter and collector of transistor 13, to reduce harmonic distortion.

Signal linearity for the low frequency components is also provided by the negative A.C. feedback path provided from the junction of capacitor 19 with speaker 18 to the base of transistor 12 via the series combination of capacitor 31 and resistor 32. Capacitor 31 provides relatively large negative feedback for the high frequency components so that any tendency for these components to be amplified at a higher level than the low frequency components, due to series coupling capacitors, is obviated. The negative feedback path cancels a significant portion of the high frequency components derived from source 11 which are fed to the base of transistor 12.

The feedback loop comprising capacitor 31 and resistor 32 considerably reduces the total harmonic distortion introduced by the nonlinear characteristics of the transistors in the network, as well as the cross-over distortion caused by transistors 14 and 15 as they are driven into and out of conduction. Distortion occurs in paraphase amplifier 13 and the class B output stages 14 and 15 because of the relatively large voltage swings to which the stages are subjected. As the signal voltage varies over a relatively large value, within one or two volts of the value of the D.C. voltage at terminal 17, the current gain of transistors 13–15 changes considerably over a single cycle. These variations in the current gain of transistors 13–15 result in the introduction of harmonic distortion. Cross-over distortion occurs for large input signals because transistors 14 and 15 are rapidly swung through their non-linear impedance regions as they switch between conducting and cut-off states.

The harmonic and cross-over distortions are largely eliminated by utilizing the negative feedback network between speaker 18 and the base of transistor 12. The non-linear waveform developed across speaker 18 is sampled by the negative feedback circuit and fed back to the base of transistor 12, which is driven by the linear signal of source 11. The non-linear portions of the fed back waveform are amplified together with the linear signal from source 11 in transistor 12. Because of the out-of-phase relationship between the fed back signal and the signal source 11, the contributions of the source which caused the distortion are eliminated to a certain extent from driver stage 13 and output transistors 14 and 15 to reduce total distortion in the network.

A preferred embodiment for the power supply utilized to provide terminal 17 with the required D.C. voltage is indicated in FIGURE 1 as including full wave rectifying diode bridge 36 having a pair of its conjugate terminals connected across the secondary winding 37 of transformer 38. Primary winding 39 of transformer 38 is adapted to be connected to a source of 60 cycle, 117 volt power and the transformer is arranged so that there is a 16.2 to 17.0 volt potential across the secondary under no load conditions. The terminals of diode bridge 36 that are not connected to secondary winding 37 are connected across the input terminals of an RC pi filter section 41. Filter section 41 comprises capacitor 42, connected directly across the output of bridge 36, and a ladder network comprising series resistance 43 and shunt capacitor 44. The D.C. voltage established across capacitor 44 varies between 23 and 22 volts for D.C. currents of 30 milliamperes and 100 milliampers, respectively.

In response to a low level signal from source 11, the current drain supplied to the amplifier by the power supply is approximately 38 ma., whereby a relatively small voltage drop exists across resistor 43. In contrast, large signals draw considerable current from the power supply, causing an increase in the voltage across resistor 43 and a reduction in the potential at terminal 17. Hence, for low level input signals, larger bias voltage is applied to the base of transistor 14 than for large amplitude signals. The difference in bias voltage across resistor 21 is such that there is virtually zero cross-over distortion for low level signals but relatively large amounts of such distortion exist for large signals.

The condition of zero cross-over distortion for output stages 14 and 15 exists for output levels up to one-half of the rated power output of the amplifier. At levels greater than one-half of the rated power output of the amplifier, the acoustic signal derived from speaker 18 could contain cross-over distortion. This distortion, however, is not apparent to the average listener because of the increased sound level reaching his ears. It has been found, that with the average listener, cross-over distortion is a deleterious effect only for low level signals, where it is non-existent in the present amplifier.

Because cross-over distortion usually occurs only above one-half of the rated output of the amplifier of the present invention, the amplifier is easily tested during fabrication. Testing is accomplished by connecting an oscilloscope across speaker 18 and connecting a variable amplitude single frequency source across potentiometer 25. The production tester observes the frequency waveform at full output on an oscilloscope. At full output, some cross-over distortion should be present in the waveform. The waveform is then reduced by reducing the potentiometer 25 from the maximum to 50 percent rotation. The output waveform at this level should contain no cross-over distortion. This technique eliminates the tester operation of observing small signal outputs for crossover distortion rejects.

To obtain proper biasing for the transistor stages, it has been found necessary to select for transformer secondary winding 37, a voltage range, of between 16.2 and 17.0 volts RMS to an open circuit load with 120 volts RMS across the primary winding of transformer 38. In addition, the open circuit DC impedance of secondary winding 37 must be in the range of between 5 and 6 ohms to provide the required biasing. These requirements are necessary in order to obtain proper biasing for crossover as stated because the base-emitter bias voltage of transistor 12 is taken from the high potential side of the DC energizing potential through resistors 22, 23, and 27. Since the base emitter bias voltage for transistor 12 ultimately controls the bias voltage applied to output transistor 14, it is necessary to maintain the former voltage regulated as nearly as possible, as is achieved with a transformer secondary having the specified parameters.

Returning now to a consideration of the advantages of the particular power supply employed in combination with the amplifier circuit, attention is directed to the tendency of the amplifier to compensate for voltage variations that occur across resistor 43 in response to changes in the current drawn by the amplifier. The D.C. current supplied to the amplifier varies as a function of the level at which output transistors 14 and 15 are driven, with the D.C. current supplied to the total amplifier decreasing as the output transistors are driven harder. As transistors 14 and 15 are driven harder, the voltage across capacitor 42, in the power supply, decreases. The decreased voltage across capacitor 42 is reflected in a lower voltage at terminal 17 and across resistor 21. The decreased voltage across resistor 21 lowers the positive bias applied to output transistors 14 and 15, thereby decreasing the D.C. collector current in these transistors and reducing D.C. power dissipation. For low signal levels, the opposite conditions prevail, wherein a relatively large voltage appears across resistor 21 and a greater D.C. collector current flows through transistors 14 and 15. Hence, it is seen that for high power output levels, A.C. power dissipation in transistors 14 and 15 is considerably in excess of the D.C. power dissipation of transistors 14 and 15. Of course, the opposite conditions prevail for low levels of source 11.

Another advantage of the power supply in combination with the amplifier network is the virtual elimination of the effects of variations in the A.C. power source magnitude applied to primary winding 39. Elimination of these variations occurs because of the combined effects of resistors 43 and 27, respectively connected in the filter for the power supply and in the feedback circuit between transistors 12 and 13. As the line voltage applied to primary winding 39 has a tendency to increase, the voltage across capacitors 42 and 44, as well as resistor 43, increases. The increased voltage suppled to the amplifier, at terminal 17, raises the voltage at the collector and base of transistor 13 so that the transistor has a tendency to be less positively biased. The voltage increase at the collector of transistor 13 is also coupled back to the base of transistor 12 through resistor 27 so that transistor 12 has a tendency to become more forwardly biased. The more forward biased condition of transistor 12 is reflected in greater current at its emitter to increase the base bias of transistor 13. Thereby, substantially the same voltage exists between the base and emitter of transistor 13 as existed there prior to the increase in the line voltage applied to primary winding 39.

To enable greater voltage swings to be derived from paraphase amplifying transistor stage 13 for both the positive and negative half cycles of source 11, a positive feedback bootstrapping connection is provided from the junction of the emitter of transistor 15 and the collector of transistor 14 to the junction between resistors 22 and 23 via coupling capacitor 45. In response to a positive A.C. signal swing applied to the base of transistor 13, the transistor emitter and collector are driven positively and negatively, respectively. The positive current derived at the emitter of transistor 13 causes the A.C. swing at the collector of transistor 14 to be driven in the negative direction. The negative A.C. swing at the collector of transistor 14 is coupled through capacitor 45 to reduce even further the negative swing at the collector of transistor 13. The further reduction in the collector voltage of transistor 13 causes greater current amplification than if the bootstrapping circuit did not exist.

In response to negative half cycles of the voltage swing applied to the base of transistor 13, the bootstrapping network through capacitor 45 provides a similar result. In particular, the negative voltage variation applied to the base of transistor 13 causes the transistor collector to swing positively, whereby the emitter voltage of transistor 15 increases. In response to the larger A.C. voltage at the emitter of transistor 15 the voltage between resistors 22 and 23 rises. The increased voltage applied back to resistors 22 and 23 through capacitor 45 is cumulative with the positive swing already being generated at the transistor collector, whereby, in response to a three volt RMS signal level for source 11, an A.C. voltage can be derived across resistors 22 and 23 equal approximately to one-half volt less than one-half of the D.C. voltage of the terminal 17.

The bootstrapping effect of capacitor 45 enables resistors 21, 22, 23 and 28 to be selected so that the collector of transistor 13 is maintained at a D.C. voltage of approximately one-half the voltage between terminals 16 and 17. Since the voltage at the collector of transistor 13 is approximately equal to one-half of the supply voltage applied to the amplifier, transistors 14 and 15 have their base emitter junctions biased to the same value to insure equal conductance periods in each of the output transistors. It is important for transistors 14 and 15 to conduct for equal time periods during each cycle of the A.C. input so that the power dissipation in each of the output transistors is equal. If power dissipation in one of the output transistors 14 or 15 becomes greater than in the other, one of the transistors dissipates more thermal energy than the other and a condition of "thermal runaway" can occur.

Another function of capacitor 45 is to reduce the ripple applied to all of the transistors in the circuit by the D.C. power supply. Ripple reduction occurs because capacitor 45, in combination with resistor 23, capacitor 19 and the inductance of speaker coil 18, functions as a filter network for the 120 c.p.s. ripple content of the power supply output. The series circuit comprising capacitors 45 and 19, together with the inductance of coil 18, provides a relatively small series impedance to shunt the 120 c.p.s. ripple components to ground. The filtering effects of capacitor 45 are particularly important in eliminating hum from preamplifier transistor 12. If the hum level applied to the emitter collector path of the preamplifier is close to being on the same order of magnitude as the low level input signal, the modulating effects of ripple on the speaker output are particularly objectionable. Capacitor 45 reduces the hum level by approximately 12 db to provide a satisfoctory audio output.

To provide positive cross-over switching of ouptut transistors 14 and 15, the anode and cathode of diode 46 are connected to the emitter and base of transistor 15, respectively. Diode 46 turns transistor 15 on while turning transistor 14 off, since it is back biased during the half cycle when a negative A.C. voltage is applied to the base of transistor 13 and is forward biased during the opposite half cycle. The back biasing relationship is seen since the collectors of transistors 13 and 14 are respectively driven positively and negatively in response to the negative going half cycle at the base of transistor 13. The opposite voltage swings occur at the collectors of transistors 13 and 14 during the positive half cycle of the voltage applied to the base of transistor 13, to render diode 46 conducting during that half cycle.

Since diode 46 is cut off when the collector of transistor 13 is swinging positively, almost all of the current supplied by the collector of transistor 13 is fed to the base of transistor 15 and virtually none is shunted through the anode cathode path of diode 46. The very small leakage current fed through diode 46 while the collector of transistor 13 is going positively, adds slightly to the collector current of transistor 14, but is not sufficiently great to cause that transistor to become conductive. During the opposite half cycle, when the collector of transistor 13 is negative and diode 46 is forward biased, virtually all of the A.C. current at the transistor 13 collector is supplied through the relatively low impedance of diode 46 and very little is fed to the base of transistor 15. In consequence, transistor 15 is positively cut off. Feeding current through diode 46 from the collector of transistor 13 has the further advantage of supplying the collector of transistor 14 with additional current so that greater total power gain can be obtained.

The amplifier circuit illustrated specifically in FIGURE 1 was designed for sources 11 of the piezoelectric crystal type, having a relatively low source capacity 26 of 470 nanofarads. The maximum output voltage of source 11 is generally on the order of 2 to 3 volts RMS. The amplifier power gain is on the order of 2 to 3 so that a minimum of 0.75 watt can be continually dissipated in speaker 18, which has an impedance of approximately 23 ohms. The frequency response of the entire network was flat from between 100 Hz. and 10 kHz. when source 11 has an internal capacity 26 with the previously mentioned value.

Reference is now made to FIGURE 3 of the drawing wherein there is illustrated a modified form of the amplifier illustrated in FIGURE 1. In the amplifier of FIGURE 3, resistor 21 is selected so that a relatively large bias of approximately 0.65 volt is established at the base of transistor 14, rather than a weak bias as in the circuit of FIGURE 1. It will be recalled that a weak bias for transistor 14, as established by resistor 21, was provided in the circuit of FIGURE 1 to prevent thermal runaway of the push-pull power output stages. In the circuit of FIGURE 3, a relatively strong bias is maintained across the emitter base junction of transistor 14 while avoiding the problems attendant with thermal runaway by inserting resistor 51 between the emitter of transistor 13 and the collector of transistor 14. The D.C. voltage drop across resistor 51 monitors the current through output transistors 13 and 14 to provide a voltage indicative of the current through the output stage.

The voltage across resistor 51 is coupled via a D.C. negative feedback connection through resistor 52 to the base of transistor 12 and the emitter of transistor 13. Resistor 52 serves the same stabilization and A.C. feedback purposes as resistor 27 in the circuit of FIGURE 1, which resistor is omitted from the network of FIGURE 3. The manner for achieving stabilization with resistor 52 can be seen by considering that as the collector current of transistor 14 increases in response to the increased temperature of the emitter base junction, the voltage across resistor 51 increases. The increased voltage across resistor 51 results in lower voltages at the collector of transistor 14 and the base of transistor 12. The reduced voltage at the base of transistor 12 causes that transistor to be less positively biased, to reduce its emitter D.C. current. In response to a reduction in the D.C. emitter current of transistor 12, the bias voltage across resistor 21 for output transistor 14 is reduced. A reduction in the D.C. bias voltage at the base of transistor 14 decreases the D.C. collector current in a manner to compensate for the increased current due to thermal effects.

Figure 4:
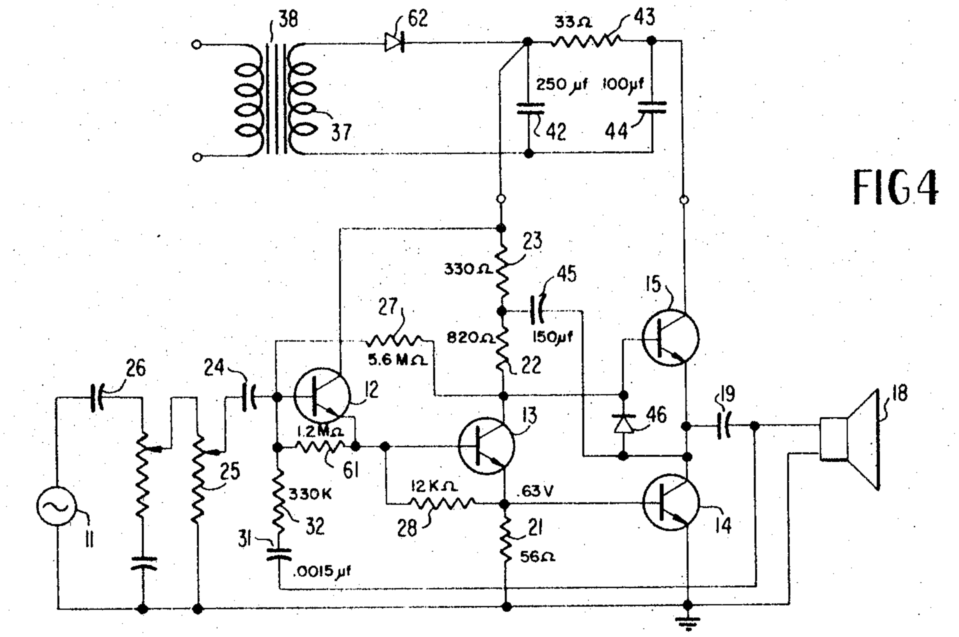
FIGURE 4 is a circuit diagram of a further modification of the circuit of FIGURE 1.

Reference is now made to FIGURE 4 of the drawing, wherein there is illustrated a further embodiment of the basic amplifier network illustrated in FIGURE 1. The network of FIGURE 4 has two basic differences relative to the circuit illustrated in FIGURE 1. The first difference concerns stabilization for the base emitter junction of driver transistor 13. Of course, variations in the bias of transistor 13 are reflected to each of the other active elements in the circuit and must be avoided. It was found with the circuit of FIGURE 1 that occasionally the base bias of transistor 13 would not be properly regulated. Changes in the bias point of transistor 13, it was found, were due to variations in the D.C. current amplification factors of preamplifier transistor 12 and paraphase driver 13.

To stablize the base voltage of transistor 13 and make it relatively immune to variations in the current amplification factor of transistor 12, which are subject to considerable changes as a function of temperature, resistor 61 is connected across the emitter base junction of transistor 12. The value of resistor 61 is selected so that the D.C. current flowing through it is considerably greater than the D.C. bias current applied to the base of transistor 12 by the path comprising resistor 27. Since the D.C. current flowing through resistor 61 is considerably larger than the base bias current of resistor 12, the total current supplied by the parallel path through the base emitter junction of transistor 12 and resistor 61 to the terminal where resistor 28 is connected to the base of transistor 13 is virtually independent of the D.C. current gain of transistor 12. Hence, relatively large variations in the current gain of transistor 12 only slightly change the biasing point of transistor 13.

The current stability contributed to transistor 12 by the addition of resistor 61 enables resistor 28 to have a smaller D.C. voltage variation in the circuit of FIG. 4 than in the circuit of FIG. 1. The emitter current flowing from transistor 12 flows to the base of transistor 13 and through resistor 28. Since the addition of resistor 61 minimizes the variation of emitter current flowing from transistor 12, due to the gain variation of transistor 12, the bias voltage across the base emitter junction of transistor 13 becomes more stabilized. Hence, in the circuit configuration of FIGURE 4, the D.C. current fed to resistor 21 is virtually independent of variations in the characteristics of transistors 12 and 13 so the bias of output transistor 14 is maintained constant.

In the amplifier of FIGURE 4, the D.C. signal level at the collector of transistor 13 is maintained relatively constant in response to the stabilized voltage across resistor 21 so that bias variations at the base of transistor 14 are avoided.

The other difference between the circuit configurations of FIGURE 1 and FIGURE 4 is that in the latter, the collector electrodes of preamplifier and driver transistors 12 and 13 are connected to a greater D.C. voltage than output transistors 14 and 15. Connecting the preamplifier and driver stages to larger voltages than the output stages enables the former to be driven to greater voltage swings than in the circuit configuration of FIGURE 1.

In the circuit of FIGURE 4, the power supply is of the half-wave rectified type and includes a transformer input identical to that of the circuit of FIGURE 1. The secondary winding 37 of transformer 38 is connected to the anode of diode 62, the cathode of which is connected to the input of the pi filter comprising capacitors 42 and 44, as well as resistor 43. The D.C. voltage derived across capacitor 44 is fed to the collector of transistor 15 to energize the emitter collector paths of output push-pull stages 14 and 15. The D.C. voltage across capacitor 42, which has a larger amplitude than the voltage across capacitor 44 but is filtered less, is supplied directly to the collector of transistor 12 and to the collector of transistor 13 through resistors 22 and 23. The reduced filtering in the power supply is ovrecome, to a large extent, by the amplifier internal filtering through capacitors 19, 45, resistor 23 and the inductance of speaker 18.

While the energization potential applied to the collectors of transistors 12 and 13 is subject to greater ripple percentage than in the circuit of FIGURE 1, it is not subject to greater ripple percentage than in the circuit of FIGURE 1, it is not subject to the voltage variations that occur across capacitor 44 in response to changes in the power level supplied by output stages 14 and 15 to speaker 18. In consequence, the tendency for the collector supply voltages of transistors 12 and 13 in FIGURE 1 to be reduced for large input signals is virtually obviated in the circuit configuration of FIGURE 4 so that the voltage and current gains of stages 12 and 13 remain relatively constant despite variations in the signal level. Since the gains of transistors 12 and 13 are constant, the D.C. bias currents supplied to resistor 37 remain relatively fixed as a function of signal level to maintain constant the relative base biases of transistors 14 and 15. Maintaining the base emitter biases of transistors 14 and 15 relatively constant as a function of input signal level eliminates a possible problem in the circuit of FIGURE 1 concerning cross-over distortion.

While the circuit of FIGURE 4 has less cross-over distortion than the network of FIGURE 1, it is not as efficient as the FIGURE 1 amplifier. Less efficiency in the circuit of FIGURE 4 occurs because greater D.C. current is fed to the bases of transistors 14 and 15 in response to large amplitude input signals.

Figure 5:
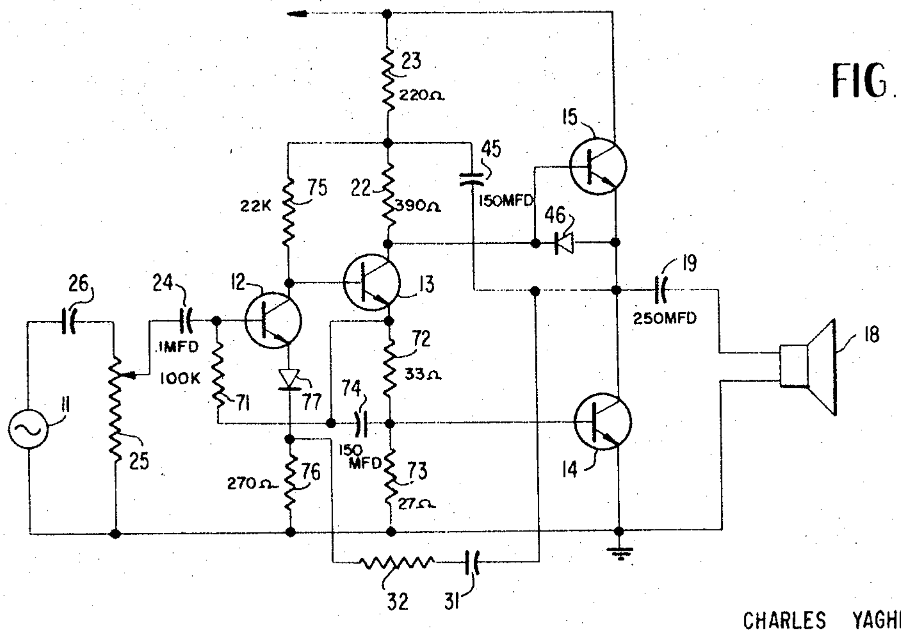
FIGURE 5 is a circuit diagram of still another modification of the present invention.

Reference is now made to FIGURE 5 of the drawing wherein there is illustrated a further modification of the basic circuit of FIGURE 1. The most important difference between the circuits of FIGURE 1 and FIGURE 5 is in the biasing circuits for transistors 12 and 13. The base of transistor 12, in FIGURE 5, is supplied with D.C. bias current from the emitter of transistor 13 through resistor 71. In order to prevent excessive positive signal feedback from the emitter of transistor 13 to the base of transistor 12, resistor 71 has a relatively large value, on the order of 100,000 ohms.

To establish a bias level necessary to achieve class A operation for transistor 12, it is necessary to raise the voltage at the emitter of transistor 13 relative to what it is in the circuit configuration of FIGURE 1. The increased bias voltage at the emitter of transistor 13 is obtained by connecting the emitter electrode to ground through the series combination of resistors 72 and 73. By connecting resistors 72 and 73 in series, the emitter electrode of transistor 13 is maintained at a voltage of approximately twice that of the corresponding emitter in the amplifier of FIGURE 1.

With the relatively large bias at the emitter of transistor 13 in FIGURE 5, the base of transistor 14 cannot be connected directly to the emitter of transistor 13. If the base of transistor 14 were connected to the emitter of transistor 13, the output stage base emitter junction would be so heavily biased that thermal runaway could occur. To prevent the effects of thermal runaway, the base emitter junction of output transistor 14 is connected to the tap between resistors 72 and 73, whereby the output transistor bias is maintained at the same stabilized value as in the circuit of FIGURE 1.

Because the base bias voltage for transistor 12 is connected through relatively low impedances to the low voltage side of the power supply, there is no need to select the transformer secondary of the circuit of FIGURE 5 with the particularity required in the circuits of FIGURES 1, 3 and 4. This is because variations in the potential of the power supply voltage do not have a relatively large effect on the bias voltage applied to the base of transistor 12 through resistors 71, 72 and 73 from the ground.

The degenerative signal effects of resistor 72 in the emitter circuit of amplifier 13 are overcome by connecting capacitor 74 in parallel with resistor 72. Capacitor 74 has a sufficiently large value that it appears as virtually a short circuit for all frequencies within the response range of the amplifier.

Because the emitter of transistor 13 is utilized to provide bias voltage for the base of transistor 12, the preamplifier stage is necessarily connected in the common emitter, rather than common collector, mode. Hence, preamplifier stage 12 provides voltage gain for the signal of source 11 and the signal voltage developed across its collector load resistor 75 is directly coupled to the base of transistor 13. Collector load resistor 75 is connected to D.C. power supply terminal 17 through resistor 23 so that the filtering effects of capacitors 19 and 45, as well as the inductance of speaker coil 18, are obtained. A further circuit change resulting from the common emitter configuration of preamplifier stage 12 is that the A.C. negative feedback path comprising capacitor 31 and resistor 32 is connected to the emitter load resistance 76 of the preamplifier stage.

One further difference between the networks of FIGURES 1 and 5 is the inclusion of diode 77 between the emitter of transistor 12 and resistors 76. Diode 77 is poled in the same direction as current flow through the collector emitter path of transistor 12 from the positive D.C. voltage at terminal 17. Diode 77 forms an auxiliary circuit, which is not always required, to assist transistor 12 in compensating for changes in the characteristics of transistor 14 that occur as a function of temperature. The voltage temperature characteristics of diode 77 are similar to those of transistors 12 and 14, so that its anode-cathode voltage decreases as a function of increasing temperature.

Without diode 77, transistor 12 has a tendency to compensate for the increased collector current of transistor 14 with rising ambient temperature because the collector voltage of the preamplifier is reduced in response to the greater current flowing through it under such conditions. A reduction in the collector voltage of transistor 12 is reflected to the base of transistor 14 as a decreased voltage tending to offset the increased collector current of the output transistor. With the inclusion of diode 77, increases in ambient temperature are reflected as lower voltages at the emitter of transistor 12.

The reduction in the D.C. voltage at the emitter of transistor 12 in response to the decreased voltage across diode 77 with increasing temperature causes more voltage to appear across the base-emitter junction of transistor 12, whereby greater current flows in the collector of transistor 12 to lower the emitter voltage of transistor 13. Thus, the voltage at the emitter of transistor 12 is reduced slightly by the decreased voltage across diode 77 while the voltage at the base of transistor 12 is also reduced slightly due to the feedback connection of the transistor through the emitter of transistor 13. The increased base-emitter bias voltage of transistor 12 introduced by diode 77 is such that the D.C. collector current of transistor 14 is maintained substantially constant as a function of temperature variations at the base-emitter junctions of transistors 12 and 14.

While I have described and illustrated several specific embodiments of my invention, it will be clear that variations of the details of construction which are specifically illustrated and described may be made without departing from the true spirit and scope of the invention.

What is claimed is:

1. A D.C. coupled push-pull amplifier comprising an output stage including first and second NPN transistors having their emitter collector paths series connected, an inductive load connected to be driven by the collector of said first transistor and the emitter of said second transsistor, a third NPN transistor connected as a paraphase driver for said first and second transistors, the emitter and collector of said third transistor being respectively connected to supply D.C. bias potentials for the bases of said first and second transistors, a fourth NPN transistor coupled to said third transistor for signal voltages, said fourth transistor having its base emitter junction responsive to an A.C. signal source, means for biasing said first and second transistors into class B operation and said third and fourth transistors into class A operation, the combined current and voltage gains of said third and first transistors for the positive half cycles applied to the base of said third transistor being approximately equal to the combined voltage and current gains of said third and second transistors for the negative half cycles applied to the base of said third transistor, a D.C. power supply for energizing the emitter collector path of each of said transistors, said supply being subject to ripple, tapped resistance means connected between the collector of said third transistor and a terminal of said power supply, and a positive feedback bootstrapping capacity connected to said tap and in circuit with said load and said first and second transistors, said capacity and load providing a low impedance filter for the ripple frequency of said supply to reduce the power supply ripple applied across each of said transistors.

2. The amplifier of claim 1 wherein said supply includes filter means for said ripple, said filter means including means for deriving first and second D.C. supply voltages, the first voltage being greater than the second and having a larger percentage of ripple, means for energizing the collector emitter paths of said third and fourth transistors with said first voltage, and means for energizing the collector emitter paths of said first and second transistors with said second voltage.

3. The amplifier of claim 2 further including diode switching means shunting the emitter base junction of said second transistor, said diode being poled to be forward biased in response to currents of opposite polarity from the currents for forward biasing the emitter base junction of said second transistor.

4. A D.C. coupled push-pull amplifier for driving a load comprising an output stage including first and second NPN transistors having their emitter collector paths series connected, means for connecting said load to be driven by the collector of said first transistor and the emitter of said second transistor, a third NPN transistor connected as a paraphase driver for said first and second transistors, the emitter and collector of said third transistor being respectively connected to supply D.C. bias potentials for the bases of said first and second transistors, a fourth NPN transistor coupled to said third transistor for signal voltages, said fourth transistor having its base emitter junction responsive to an A.C. signal source, means for biasing said first and second transistors into class B operation and said third and fourth transistors into class A operation, the combined current and voltage gains of said third and first transistors for the positive half cycles applied to the base of said third transistor being approximately equal to the combined voltage and current gains of said third and second transistors for the negative half cycles applied to the base of said third transistor, said biasing means comprising a D.C. resistive connection from the collector of said third transistor to the emitter base junction of said fourth transistor.

5. The amplifier of claim 4 further including diode switching means shunting the emitter base junction of said second transistor, said diode being poled to be forward biased in response to currents of opposite polarity from the currents for forward biasing the emitter base junction of said second transistor.

6. The amplifier of claim 5 further including negative feedback means for feeding back only the A.C. voltage across said load to the emitter base junction of said fourth transistor.

7. The amplifier of claim 6 wherein said feedback means includes a series capacitor for feeding back high frequency voltages with less attenuation than low frequency voltages.

8. A D.C. coupled push-pull amplifier for driving a load comprising an output stage including first and second NPN transistors having their emitter collector paths series connected, means for connecting the load to be driven by the collector of said first transistor and the emitter of said second transistor, a third NPN transistor connected as a paraphase driver for said first and second transistors, the emitter and collector of said third transistor being respectively connected to supply D.C. bias potentials for the bases of said first and second transistors, a fourth NPN transistor coupled to said third transistor for signal voltages, said fourth transistor having its base emitter junction responsive to an A.C. signal source, means for biasing said first and second transistors into class B operation and said third and fourth transistors into class A operation, the combined current and voltage gains of said third and first transistors for the positive half cycles applied to the base of said third transistor being approximately equal to the combined voltage and current gains of said third and second transistors for the negative half cycles applied to the base of said third transistor, said biasing means comprising an emitter load resistance for said third transistor, the voltage developed across said emitter load resistance biasing and supplying signals to the base emitter junction of said first transistor, first D.C. circuit means connected between the emitter base junction of said fourth transistor and an electrode of one of said other transistors for biasing said fourth transistor, and second D.C. circuit means for feeding all of the emitter current of said fourth transistor in parallel to the base emitter junction of said third transistor and a D.C. impedance shunting the emitter base junction of said third transistor, said D.C. shunting impedance being much less than the base emitter junction impedance of said third transistor to establish the base emitter bias of said third transistor and maintain the D.C. emitter current of said fourth transistor substantially constant despite changes in the impedance of the junction of said third transistor.

9. The amplifier of claim 8 wherein said first D.C. circuit means comprises tapped resistance means connected in D.C. circuit between said electrode of said other transistor and the emitter base junction of said fourth transistor, the tap of said resistance means connected to bias the base of said fourth transistor, the resistance means connected between the base and emitter of said fourth transistor having an impedance much less than the base emitter junction of said fourth transistor to establish the base emitter bias of said fourth transistor and maintain the D.C. current supplied by said electrode of said other transistor to said resistance means substantially constant despite changes in the impedance of the junction of said fourth transistor.

10. The amplifier of claim 9 further including diode switching means shunting the emitter base junction of said second transistor, said diode being poled to be forward biased in response to currents of opposite polarity from the currents for forward biasing the emitter base junction of said second transistor.

11. The amplifier of claim 10 further including negative feedback means for feeding back only the A.C. voltage across said load to the emitter base junction of said fourth transistor.

12. The amplifier of claim 11 wherein said feedback means includes a series capacitor for feeding back high frequency voltages with less attenuation than low frequency voltages.

13. The circuit of claim 9 wherein said electrode of said other transistor is the collector of said third transistor, said emitter load resistance having a value to establish a relatively slight forward bias for the emitter base junction of said first transistor.

14. The amplifier of claim 13 further including negative feedback means for feeding back only the A.C. voltage across said load to the emitted base junction of said fourth transistor.

15. The amplifier of claim 14 wherein said feedback means includes a series capacitor for feeding back high frequency voltages with less attenuation than low frequency voltages.

16. The amplifier of claim 8 further including diode switching means shunting the emitter base junction of said second transistor, said diode being poled to be forward biased in response to currents of opposite polarity from the currents for forward biasing the emitter base junction of said second transistor.

17. The circuit of claim 8 wherein said electrode of said other transistor is the collector of said third transistor, said emitter load resistance having a value to establish a relatively slight forward bias for the emitter base junction of said fist transistor.

18. A D.C. coupled push-pull amplifier for driving a load comprising an output stage including first and second NPN transistors having their emitter collector paths series connected, means for connecting the load to be driven by the collector of said first transistor and the emitter of said second transistor, a third NPN transistor connected as a paraphase driver for said first and second transistors, the emitter and collector of said third transistor being respectively connected to supply D.C. bias potentials for the bases of said first and second transistors, a fourth NPN transistor coupled to said third transistor for signal voltages, said fourth transistor having its base emitter junction responsive to an A.C. signal source, means for biasing said first and second transistors into class B operation and said third and fourth transistors into class A operation, the combined current and voltage gains of said third and first transistors for the positive half cycles applied to the base of said third transistor being approximately equal to the combined voltage and current gains of said third and second transistors for the negative half cycles applied to the base of said third transistor, and negative feedback means for feeding back only the A.C. voltage across said load to the emitter base junction of said fourth transistor.

19. The amplifier of claim 18 wherein said feedback means includes a series capacitor for feeding back high frequency voltages with less attenuation than low frequency voltages.

20. The amplifier of claim 19 further including diode switching means shunting the emitter base junction of said second transistor, said diode being poled to be forward biased in response to currents of opposite polarity from the currents for forward biasing the emitter base junction of said second transistor.

21. The circuit of claim 8 further including resistance means for sampling the D.C. current in the emitter collector paths of said first and second transistors, wherein said electrode of said other transistor is in the emitter collector paths of said first and second transistors, said first D.C. circuit means supplying a negative feedback signal to the emitter base junction of said fourth transistor in response to the sampled current, and said emitter load resistance having a value to establish a relatively large forward bias for the emitter base junction of said first transistor.

22. A D.C. coupled push-pull amplifier for driving a load comprising an output stage including first and second NPN transistors having their emitter collector paths series connected, means for connecting the load to be driven by the collector of said first transistor and the emitter of said second transistor, a third NPN transistor connected as a paraphase driver for said first and second transistors, the emitter and collector of said third transistor being respectively connected to supply D.C. bias potentials for the bases of said first and second transistors, a fourth NPN transistor coupled to said third transistor for signal voltages, said fourth transistor having its base emitter junction responsive to an A.C. signal source, means for biasing said first and second transistors into class B operation and said third and fourth transistors into class A operation, the combined current and voltage gains of said third and first transistors for the positive half cycles applied to the base of said third transistor being approximately equal to the combined voltage and current gains of said third and second transistors for the negative half cycles applied to the base of said third transistor, said biasing means comprising tapped emitter load resistance means for said third transistor, the voltage developed between the tap and one terminal of said resistance means slightly forward biasing and supplying signals to the base emitter junction of said first transistor, and D.C. circuit means for biasing the base emitter junction of said fourth transistor with all of D.C. voltage developed at the emitter of said third transistor.

23. The amplifier of claim 22 further including means for short circuiting the portion of resistance means between said tap and the emitter of said third transistor for only A.C. signals.

24. The amplifier of claim 23 further including a diode connected in the emitter collector path of said fourth transistor, said diode being poled for conduction in the same direction of current flow through the emitter collector path of said fourth transistor.

25. The amplifier of claim 24 further including diode switching means shunting the emitter base junction of said second transistor, said diode switching means being poled to be forward biased in response to currents of opposite polarity from the currents for forward biasing the emitter base junction of said second transistor.

26. The amplifier of claim 25 further including negative feedback means for feeding back only the A.C. voltage across said load to the emitter base junction of said fourth transistor.

27. The amplifier of claim 26 wherein said feedback means includes a series capacitor for feeding back high frequency voltages with less attenuation than low frequency voltages.

28. The amplifier of claim 22 further including a diode connected in the emitter collector path of said fourth transistor, said diode being poled for conduction in the same direction as the direction of current flow through the emitter collector path of said fourth transistor.

29. A D.C. coupled push-pull amplifier for driving a load comprising an output stage including first and second NPN transistors having their emitter collector paths series connected, means for connecting the load to be driven by the collector of said first transistor and the emitter of said second transistor, a third NPN transistor connected as a paraphase driver for said first and second transistors, the emitter and collector of said third transistor being respectively connected to supply D.C. bias potentials for the bases of said first and second transistors, a fourth NPN transistor coupled to said third transistor for signal voltages, said fourth transistor having its base emitter junction responsive to an A.C. signal source, means for biasing said first and second transistors into class B operation and said third and fourth transistors into class A operation, the combined current and voltage gains of said third and first transistors for the positive half cycles applied to the base of said third transistor being approximately equal to the combined voltage and current gains of said third and second transistors for the negative half cycles applied to the base of said third transistor, said biasing means comprising an emitter load resistance for said third transistor, the voltage developed across said emitter load resistance biasing and supplying signals to the base emitter junction of said first transistor, first D.C. circuit means connected between the emitter base junction of said fourth transistor and an electrode of one of said other transistors for biasing said fourth transistor, and second D.C. circuit means for feeding all of the emitter current of said fourth transistor in parallel to the base emitter junction of said third transistor and a D.C. impedance shunting the emitter base junction of said third transistor, said D.C. shunting impedance being much less than the base emitter junction impedance of said third transistor to establish the base emitter bias of said third transistor and maintain the D.C. emitter current of said fourth transistor substantially constant despite changes in the impedance of the junction of said third transistor, resistance means for sampling the D.C. current in the emitter collector paths of said first and second transistors, wherein said electrode of said other transistor is in the emitter collector paths of said first and second transistors, said first D.C. circuit means supplying a negative feedback signal to the emitter base junction of said fourth transistor in response to the sampled current, and said emitter load resistance having a value to establish a relatively large forward bias for the emitter base junction of said first transistor.

References Cited

UNITED STATES PATENTS

| | | | |
|---|---|---|---|
| 2,488,567 | 11/1949 | Stodola | 330—70 |
| 3,320,543 | 5/1967 | Hopengarten et al. | 330—15 |

FOREIGN PATENTS

| | | |
|---|---|---|
| 213,957 | 3/1961 | Austria. |
| 1,021,030 | 12/1957 | Germany. |

OTHER REFERENCES

Berding, "Complementary Output Circuit using all NPNS," IBM Technical Disclosure Bulletin, vol. 6, No. 12, May 1964, p. 28.

Electronics World, October 1966, pp. 36, 94, 95.

Geisler, "Transistor Power Amplifier Circuit Directory," Radio-Electronics, October 1963, pp. 32, 33.

ROY LAKE, Primary Examiner

J. B. MULLINS, Assistant Examiner

U.S. Cl. X.R.

330—18, 19, 22, 25, 17, 28